United States Patent [19]

Greub

[11] Patent Number: 4,833,695
[45] Date of Patent: May 23, 1989

[54] APPARATUS FOR SKEW COMPENSATING SIGNALS

[75] Inventor: Hans J. Greub, Troy, N.Y.

[73] Assignee: Tektronix, Inc., Beaverton, Oreg.

[21] Appl. No.: 93,930

[22] Filed: Sep. 8, 1987

[51] Int. Cl.$^4$ .............................................. H04L 7/00
[52] U.S. Cl. .................................. 375/118; 375/110;
   358/150; 331/1 A; 331/57
[58] Field of Search ............... 375/110, 118, 119, 120;
   358/150; 307/597, 602, 603; 371/108; 328/55;
   331/1 A, 55, 57

[56] References Cited

U.S. PATENT DOCUMENTS

| | | | |
|---|---|---|---|
| 4,513,427 | 4/1985 | Borriello et al. | 375/110 |
| 4,575,860 | 3/1986 | Scordo | 375/110 |
| 4,622,665 | 11/1986 | Jönsson et al. | 375/110 X |

Primary Examiner—Derek S. Jennings
Attorney, Agent, or Firm—Daniel J. Bedell; Robert S. Hulse

[57] ABSTRACT

A clock signal is transmitted to nodes of each of several interconnected circuits through a separate adjustable delay circuit, the time delay of each delay circuit being adjusted so that the clock signal arrives at each node at the same time, thereby synchronizing operation of the separate integrated circuits one to another. Each delay circuit comprises a set of signal delay elements which can be selectively switched into the clock signal path so that the clock signal delay may be adjusted by adjusting the number of signal delay elements in the clock signal path. Each signal delay element itself has a unit delay adjustable in proportion to an applied control voltage generated by a delay element monitor. The delay element monitor measures the unit delay in relation to the period of a stable reference clock and adjusts the delay of each delay element as necessary to ensure that the unit delay remains constant.

15 Claims, 6 Drawing Sheets

APPARATUS FOR SKEW COMPENSATING SIGNALS

BACKGROUND OF THE INVENTION

The present invention relates to a signal skew compensation circuit for adjustably delaying a plurality of signals so that they arrive at various nodes of a circuit at the same time.

Operations of separate parts of a typical large scale digital logic circuit are synchronized by one or more clock signals transmitted to many nodes in the circuit. For such a circuit to operate properly each pulse of a clock signal should arrive at each node within a time window that is substantially smaller than the period of the clock in order to avoid loss of synchronization. It is advantageous to implement a large digital logic circuit as a single integrated circuit because the various nodes in the circuit to which a clock signal may be transmitted are close together and clock signal pulses arrive at each node in the circuit at about the same time regardless of where the clock signal generator is located. Thus the frequency of operation of a single integrated circuit is usually not limited by variation in arrival time of clock signal pulses (i.e., "clock skew") at various nodes within the circuit.

However, when a digital circuit is too large to be implemented as a single integrated circuit, it is necessary to partition the circuit into two or more integrated circuits interconnected by signal conductors which may be relatively long with respect to signal paths within each integrated circuit. In such case, a clock signal pulse originating in one integrated circuit may arrive at various nodes in other integrated circuits at substantially different times due to variation in signal delay of the signal paths the clock pulse must follow to reach each integrated circuit. Loss of synchronization due to clock skew can be avoided by reducing the frequency of the clock signal, but that reduces the speed of circuit operation. Partitioned circuits may also be designed so that each integrated circuit uses a separate clock and so that separate integrated circuits communicate asynchronously. But asynchronous communication between portions of a circuit involves time consuming handshaking protocols, and the time needed to perform handshaking reduces the rate at which data can be exchanged.

SUMMARY OF THE INVENTION

In accordance with one aspect of the invention, a clock signal is transmitted to nodes of each of several interconnected synchronous integrated circuits through separate adjustable delay circuits, and the time delay of each delay circuit is adjusted so that the clock signal arrives at each node at the same time, thereby synchronizing operation of the separate integrated circuits one to another.

In accordance with another aspect of the invention, each delay circuit comprises a set of signal delay elements which can be selectively switched in series with the clock signal path whereby the clock signal delay may be adjusted by adjusting the number of signal delay elements in the clock signal path. Each signal delay element itself has a unit delay which is adjustable in proportion to an applied control voltage generated by a delay element monitor. The delay element monitor measures the unit delay in relation to the period of a reference clock and adjusts the delay of each delay element as necessary to ensure that the unit delay remains at a constant predetermined value despite changes in ambient temperature or aging of circuit components.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

DETAILED DESCRIPTION

Figure 1:
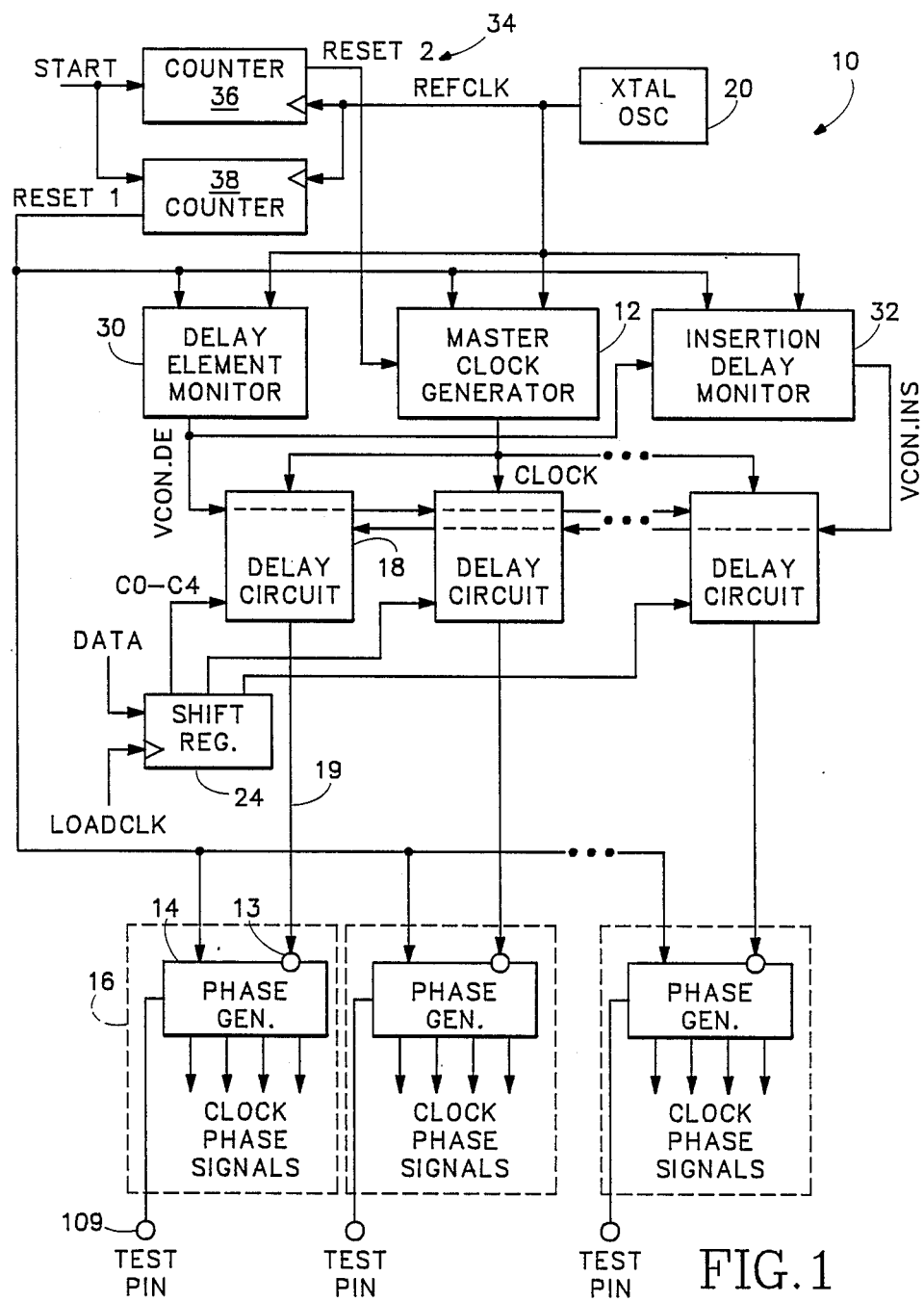
FIG. 1 is a block diagram of a skew compensation circuit in accordance with the present invention.

With reference to FIG. 1, a skew compensation circuit 10 in accordance with the present invention is adapted to transmit a clock signal (CLOCK) generated by a master clock generator 12 to nodes 13 within each of a plurality of separate integrated circuits 16. The CLOCK signal is transmitted to each node 13 via separate adjustable delay circuits 18 and transmission lines 19, and each delay circuit 18 is adjusted to delay the CLOCK signal so that each pulse of the CLOCK signal arrives at each node 13 substantially at the same time. A phase generator 14 implemented in each integrated circuit 16 monitors the clock signal arriving at node 13 and produces one or more clock phase signals used to control the timing of the integrated circuit 16 in which it is implemented. Clock phase signals are produced sequentially at regular intervals after receipt of the first pulse of the CLOCK signal following deassertion of a RESET1 signal applied as input to the phase generator, and following receipt of every CLOCK signal pulse thereafter. Since the operation of each integrated circuit 16 is synchronized to the same master CLOCK signal, and since each CLOCK signal pulse arrives at each integrated circuit at the same time, the separate integrated circuits 16 may operate together in a synchronous fashion and exchange data with each other without need for asynchronous communication channels.

The master clock generator 12 is suitably a resettable phase-locked loop circuit producing N output CLOCK signal pulses in response to every pulse of an input reference clock signal (REFCLK). The REFCLK signal may be produced, for example, by a crystal-controlled oscillator 20 having a highly stable frequency. The master clock generator 12 also has an input for a RE- SET2 signal which, when asserted, drives the CLOCK output of the clock generator high, and prevents the generator from generating CLOCK signal pulses. A startup control circuit 34 asserts the RESET2 signal to reset the master clock generator 12 on receipt of an externally generated START signal. At the same time, the startup control circuit 34 asserts the RESET1 signal that resets each phase generator. The startup control circuit 34 then deasserts the RESET1 signal to enable phase generator operation and thereafter deasserts the RESET2 signal to enable master clock generator operation.

The startup control circuit 34 suitably comprises two counters 36 and 38 for counting pulses of the REFCLK signal, each count being reset by the START signal. Counter 36 asserts the RESET2 signal and counter 38 asserts the RESET1 signal upon receipt of the START signal. Counter 36 deasserts the RESET2 signal after it has counted a predetermined number of REFCLK signal pulses, and counter 38 deasserts the RESET1 signal after it has counted a lower number of REFCLK signal pulses.

The amount of CLOCK signal delay provided by each delay circuit 18 is determined by five-bit control data C0–C4 separately supplied to each delay circuit through a shift register 24 which shifts in each bit of an externally generated serial DATA input in response to each pulse of an externally generated LOADCLK signal pulse. The delay of each delay circuit 18, as set by data C0–C4, is stabilized by a pair of annalog control signals VCON.DE and VCON.INS respectively produced by a delay element monitor 30 and an insertion delay monitor 32 as described in detail hereinbelow.

Figure 2:
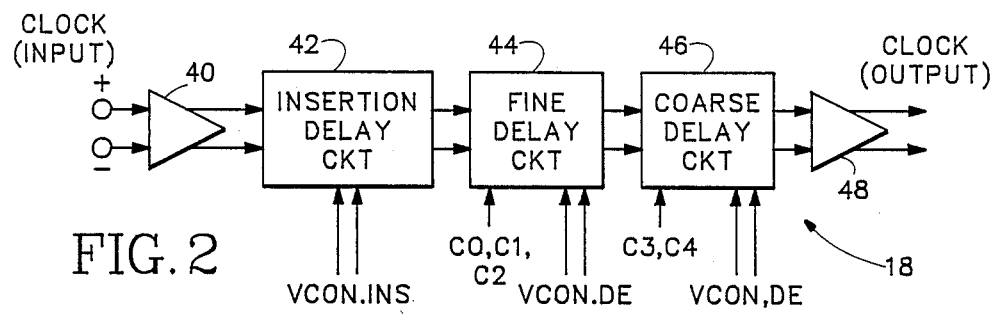
FIG. 2 is a block diagram of a delay circuit of FIG. 1.

FIG. 2 shows a block diagram of a typical delay circuit 18 of FIG. 1 including an input buffer 40 for buffering the input CLOCK signal, a sequence of adjustable delay circuits (insertion delay circuit 42, fine delay circuit 44 and coarse delay circuit 46) for successively delaying the output of buffer 40 by adjustable delay times, and an output buffer 48 for buffering the output of coarse delay circuit 46 so as to produce the delayed CLOCK signal output of delay circuit 18. The delay of coarse delay circuit 46 may be adjusted to $mT + I_1$ seconds, where m is an integer from 0–3, T is a fixed unit delay time and $I_1$ is a constant "insertion" delay, the minimum delay of circuit 46. The selection of m is determined by the values of bits C3 and C4 of the control input data C0–C4 shown in FIG. 1.

The fine delay circuit 44 may be adjusted for a delay of $(n/8)T + I_2$ seconds where n is an integer from 0 to 7 determined by the value of control data bits C0–C2, T is the fixed unit delay time, and $T_2$ is the constant insertion delay of circuit 44. The delay ($D_{ins}$) of the insertion delay circuit 42 may be continuously adjusted over its full range in accordance with the magnitude of the VCON.INS control signal output of insertion delay monitor 32 of FIG. 1. The unit delay T of the fine and coarse delay circuits 44, 46 is controlled in accordance with the magnitude of the VCON.DE signal produced by the delay element monitor 30 of FIG. 1.

Given that buffers 40 and 48 have delays of $D_1$ and $D_2$ respectively, the total delay $T_{tot}$ of delay circuit 18 is the sum of the delays provided by its constituent devices 40–48:

$$T_{tot} = D_1 + D_{ins} + (mT + I_1) + (nT/8 + I_2) + D_2. \quad [1]$$

Rearranging terms of equation [1]:

$$T_{tot} = [m + (n/8)]T + T_{ins} \quad [2]$$

where $$T_{ins} = (D_1 + D_2 + I_1 + I_2 + D_{ins}). \quad [3]$$

The first term of equation [2] shows that the delay of circuit 18 may be adjusted to 32 levels in steps of T/8 seconds depending on the various combinations of values of m and n as determined by control data C0–C4. The second term of equation [2], $T_{ins}$, is the total insertion delay of delay circuit 18, the minimum delay that it provides when m = n = 0.

In order to ensure that the delay $T_{tot}$ of the circuit remains constant once the values of m and n are selected, it is necessary that both T and $T_{ins}$ remain constant. As mentioned hereinabove, the value of T is controlled by the VCON.DE output signal of delay element monitor 30 of FIG. 1 and the value of the $D_{ins}$ component of $T_{ins}$ of equation [3] is controlled by the VCON.DE output signal of insertion delay monitor 32 of FIG. 1. As described in detail hereinbelow, delay element monitor 30 is a phase-locked loop circuit that continuously monitors the unit delay T and adjusts VCON.DE so that T remains constant. Similarly insertion delay monitor 32 continuously monitors $T_{ins}$ and adjusts VCON.INS to ensure that $T_{ins}$ remains constant.

Figure 3:
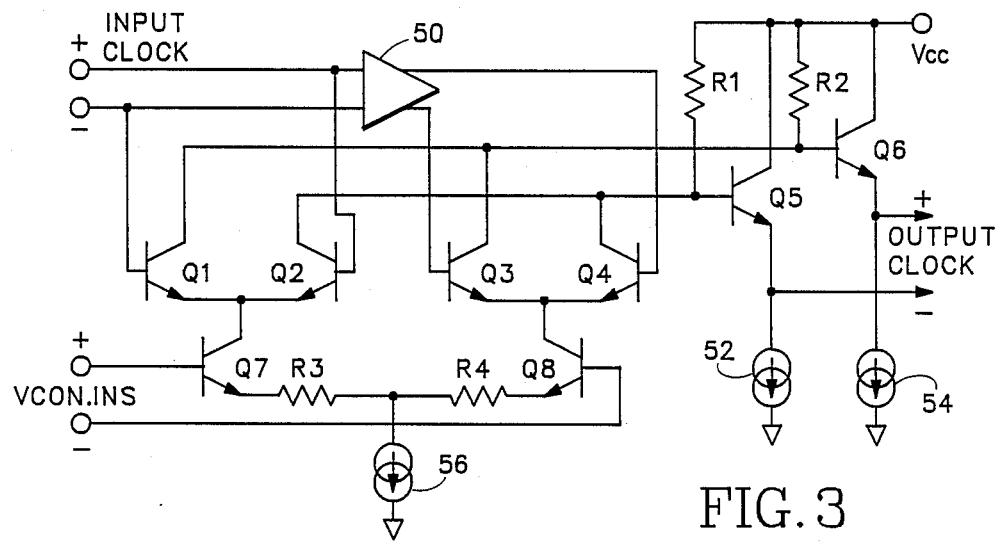
FIG. 3 is a schematic diagram of a delay element.

The insertion delay circuit 42 is implemented by an adjustable delay element depicted in schematic diagram form in FIG. 3. In the preferred embodiment of the invention, the CLOCK signal and the VCOM.INS control signal are differential signals as shown in FIG. 3. The differential input CLOCK signal is applied across the bases of an emitter-coupled transistor pair Q1, Q2 and also as input to a buffer 50 which delays the input CLOCK signal by a small amount. The output of buffer 50 is applied across the bases of another emitter-coupled transistor pair Q3, Q4. The collectors of transistors Q1 and Q3 drive the base of an output buffer transistor Q6 and the collectors of transistors Q2 and Q4 drive the base of another output buffer transistor Q5. The bases of transistors Q5 and Q6 are coupled to a positive voltage source Vcc through resistors R1 and R2, respectively, and the emitters of transistors Q5 and Q6 are coupled to ground through matching current sources 52 and 54, respectively. The emitters of transistors Q1 and Q2 are tied to the collector of a transistor Q7 and the emitters of transistors Q3 and Q4 are tied to the collector of a transistor Q8. The emitters of transistors Q7 and Q8 are coupled to a current source 56 through resistors R3 and R4, respectively. The VCON.INS control signal is applied across the bases of transistors Q7 and Q8. The delayed output CLOCK signal appears across the emitters of transistors Q5 and Q6.

VCON.INS controls the relative proportion of the current output of current source 56 that is transmitted to the emitters of transistors Q1 and Q2 or to the emitters of transistors Q3 and Q4. Transistors Q1 and Q2 form a differential amplifier which amplifies the input CLOCK at the bases of transistors Q1 and Q2 to produce a first output differential current signal at their collectors. The gain of the Q1,Q2 amplifier is determined by the proportion of current from current source 56 supplied to the transistor emitters through transistor Q7. Similarly, transistors Q3 and Q4 form a differential amplifier which amplifies the buffer 50 output signal at the bases of transistors Q3 and Q4 to produce a second output differential current signal at the transistor collectors. The gain of the Q3,Q4 amplifier is determined by the proportion of current from current source 56 supplied to the transistor emitters through transistor Q8.

On the rising edge of an input CLOCK signal pulse, transistor Q1 immediately begins to pull up the base of transistor Q6 and transistor Q2 begins to pull down the base of transistor Q5, thereby causing the output CLOCK signal voltage across the bases of transistors Q5 and Q6 to begin to go high. However, various capacitances in transistors Q1, Q2, Q5 and Q6 prevent the output CLOCK signal from rising abruptly. Buffer 50 has an inherent delay, and some time after the rising edge of the input CLOCK signal arrives at buffer 50, buffer 50 drives its output signal high, thereby causing transistor Q3 to begin pulling up the base of transistor Q6 and causing transistor Q4 to begin pulling down the base of transistor Q5.

Figure 4:
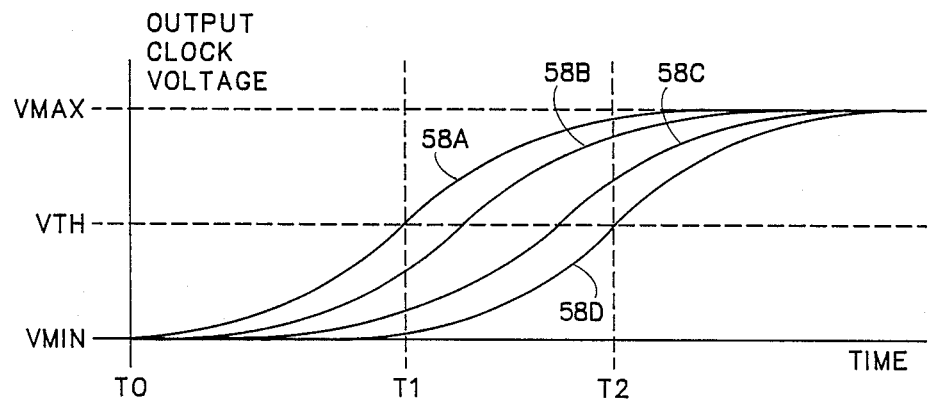
FIG. 4 is a timing diagram illustrating operation of the delay element of FIG. 3.

FIG. 4 is a timing diagram showing the way in which the output CLOCK signal changes from a minimum negative voltage VMIN to a maximum positive voltage VMAX after the rising edge of the input CLOCK signal arrives at the delay element at time T0. If VCON.INS is large and positive, then substantially all of the current output of current source 56 is directed to the emitters of transistors Q1 and Q2; transistors Q3 and Q4 are off and do not supply any current to the bases of transistors Q5 and Q6. In such case the amplitude of the delayed output CLOCK signal increases quickly as shown by curve 58A. Alternatively when VCON.INS is large and negative, transistors Q3 and Q4 are on and transistors Q1 and Q2 are off, and the output CLOCK signal voltage changes only in response to the delayed output of buffer 50. In such case the output CLOCK signal voltage rise is delayed by the delay time of buffer 50 as illustrated by curve 58D. By inspection of curves 58A and 58D, it can be seen that the output CLOCK signal rises above a threshold voltage VTH at time T1 when transistors Q1 and Q2 convey all of the current of current source 56 and rises above VTH at time T2 when transistors Q3 and Q4 convey all of the current of current source 56. If VTH is the threshold voltage at which the output CLOCK signal is considered to change state, then the "delay" of the delay element of FIG. 3 is the time at which the output CLOCK signal rises above the threshold voltage. Curve 58B shows the rise in output CLOCK signal voltage when transistors Q1 and Q2 carry about 80% of the current and transistors Q3 and Q4 carry about 20% of the current. Curve 58C shows the rise in output CLOCK signal voltage when transistors Q1 and Q2 carry about 20% of the current and transistors Q3 and Q4 carry about 80% of the current. Thus it can be seen that by adjusting the magnitude of VCON.INS, the delay of the delay element may be adjusted to any value between T1 and T2.

Figure 5:
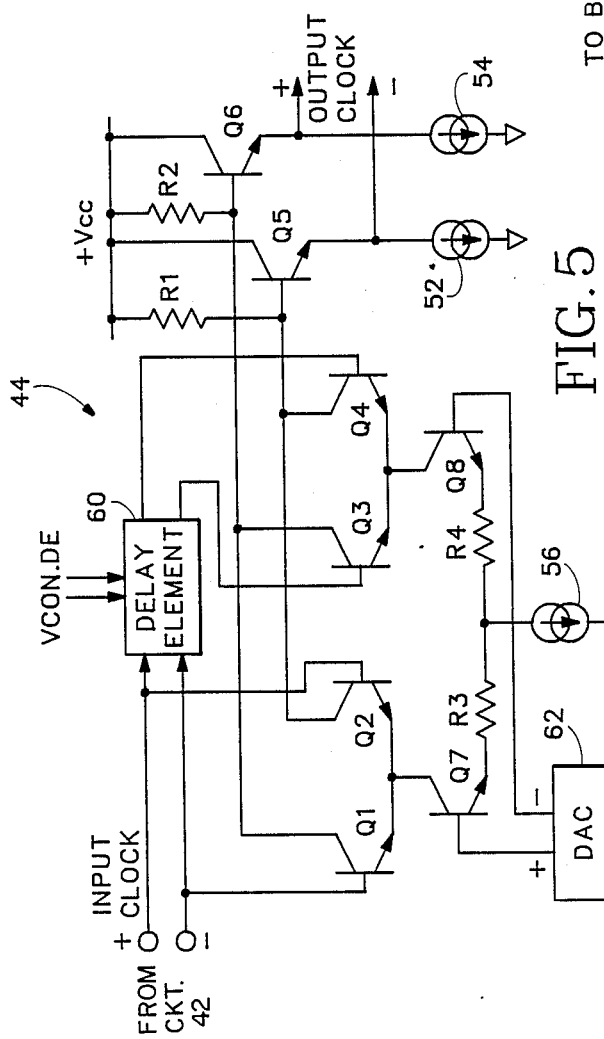
FIG. 5 is a schematic diagram of the fine delay circuit of FIG. 2.

As illustrated in FIG. 5, fine delay circuit 44 of FIG. 2 is similar to the delay element of FIG. 3 except that buffer 50 of FIG. 3 is replaced with another adjustable delay element 60 similar to the delay element of FIG. 3, and the control signal applied across the bases of transistors Q7 and Q8 is produced by a digital to analog converter (DAC) 62 in accordance with the input data C0–C2. The delay of delay element 60 is controlled by the VCON.DE signal so that it remains constant.

Figure 6:
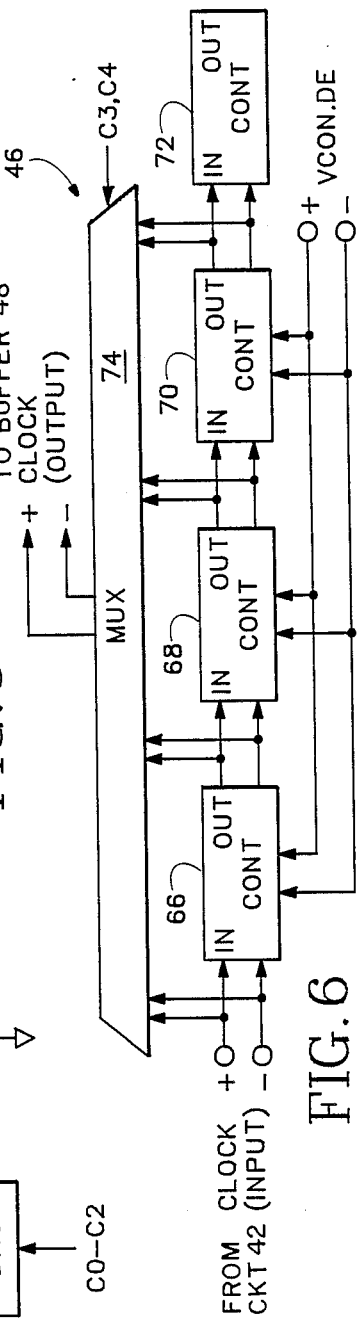
FIG. 6 is a schematic diagram of the coarse delay circuit of FIG. 2.

The coarse delay circuit 46, shown in more detail in FIG. 6, includes a set of four delay elements 66, 68, 70 and 72 connected in series and a multiplexer 74 which may selectively transmit either the CLOCK signal input to coarse delay circuit 46, or the output of one of delay elements 66, 68, or 70 to buffer 48 of FIG. 2. The output of delay element 72 is not used, but element 72 is provided so that elements 66–70 all have similar output loading. The multiplexer 74 switching state is determined by the C3 and C4 control data bits applied thereto. The delay of each delay element 66–72 is the unit delay T, and the unit delay is held to a constant value by the VCON.DE signal applied as control input to each delay element. Delay elements 66–72 are similar to the delay element shown in schematic diagram form in FIG. 3 except that VCON.DE rather than VCON.INS is applied across the base of transistors Q7 and Q8.

Figure 7:
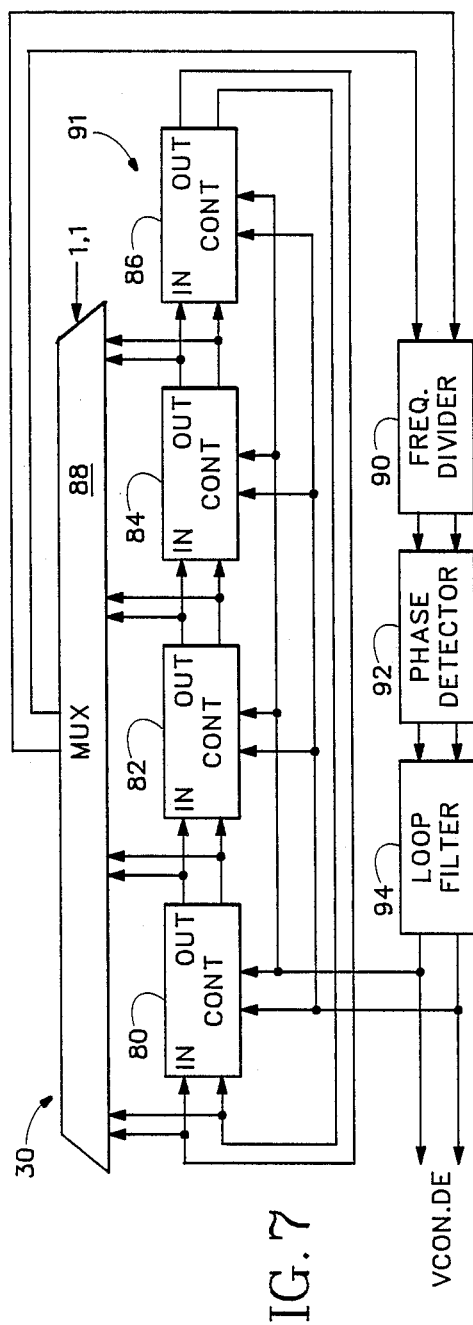
FIG. 7 is a schematic diagram of the delay element monitor of FIG. 1.

FIG. 7 is a block diagram of the delay element monitor 30 of FIG. 1. A set of delay elements 80, 82, 84, and 86, similar to delay elements 66–72 of FIG. 6, are connected in series with the output signal of element 86 being inverted and applied as input to element 80, thereby forming a ring-type oscillator 91 of period 8T, where T is the unit delay of each element 80–86. The output of each element is applied to a separate input of a 4x1 multiplexer 88, similar to multiplexer 74 of FIG. 6. The two control input bits to multiplexer 88 are tied to a voltage source of logic level "1" so that multiplexer 88 always selects the output of delay element 84. The output of multiplexer 88 is provided as an input to a frequency divider 90, which divides the frequency of its input signal by a factor of K to produce an output signal applied to a phase detector 92. Phase detector 92 compares the output of divider 90 to the reference clock signal REFCLK and produces an output signal which is high or low depending on whether the output signal produced by divider 90 leads or lags REFCLK. The phase detector output signal is filtered by a filter 94 to produce the VCON.DE output signal of the delay element monitor 30. VCON.DE is also applied to the control inputs of delay elements 80–86. Thus the output signal of divider 90 is phase locked to REFCLK, and the duration of the unit delay T of each delay element 80–86 is determined by the frequency dividing ratio K of frequency divider 90 in accordance with the expression $$T = 8 T_{ref}/K \qquad [4$$

where $T_{ref}$ is the period of REFCLK. When REFCLK is produced by a highly stable source such as a crystal oscillator, T is highly stable and not affected by changes in ambient temperature or variation in material or the fabrication process utilized to manufacture integrated circuits employing the delay elements.

Figure 8:
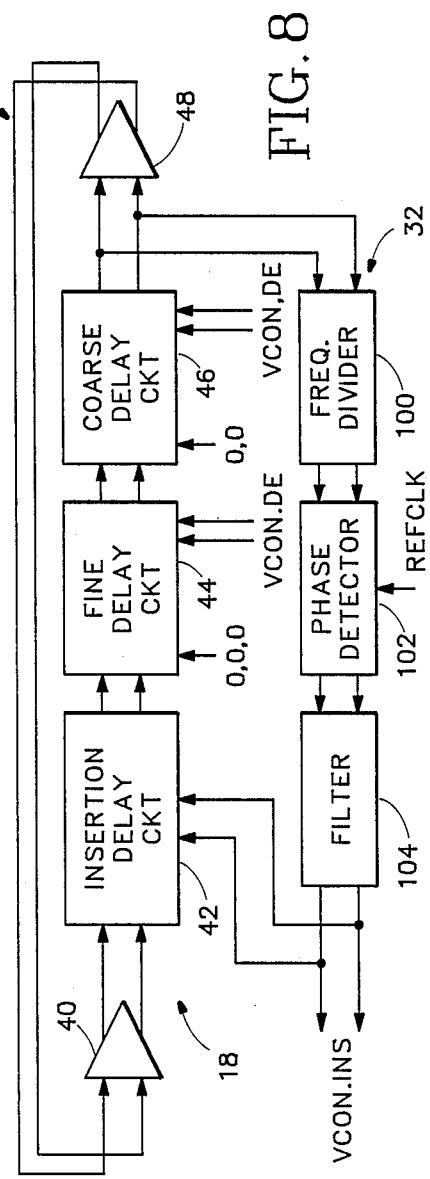
FIG. 8 is a schematic diagram of the insertion delay monitor of FIG. 1.

With reference to FIG. 8, showing the insertion delay monitor 32 of FIG. 1 in more detailed block diagram form, monitor 32 includes another delay circuit 18 identical to the delay circuits 18 of FIGS. 1 and 2 including input and output buffers 40 and 48, an insertion delay circuit 42, fine delay circuit 44 and coarse delay circuit 46. However in the delay circuit 18 of FIG. 8, the output of buffer 48 is negatively fed back to the input of buffer 40 to form an oscillator 101. The output of coarse delay circuit 46 is provided as input to a frequency divider 100, which divides the frequency of its input signal by a factor of M to produce its output signal. The output of frequency divider 100, along with the reference clock REFCLK signal, are applied as inputs to a phase detector 102 similar to phase detector 92 of FIG. 7. The output of phase detector 102 is filtered by a filter 104 to produce the VCON.INS output signal of delay monitor 32.

The VCON.INS signal is applied to the control input of insertion delay circuit 42 while the VCON.DE signal is applied to the control inputs of delay circuits 44 and 46. The C0–C4 inputs of fine delay circuit 44 and coarse delay circuit 46 are tied to a "0" logic level source such that the delay of fine delay circuit 44 is its insertion delay $I_2$ and such that the delay of coarse delay circuit 46 is its insertion delay $I_1$. Thus the total delay between the input of buffer 40 and the output of buffer 48 is equal to insertion delay $T_{ins}$, as defined by equation [3] hereinabove, and the period of oscillation of the output signal of frequency divider 100 is $MT_{ins}$. Since the frequency divider output signal is phase locked to the period $T_{ref}$ of the reference clock, $$T_{ins} = T_{ref}/M. \quad [5]$$

Since M is a constant and $T_{ref}$ is highly stable, $T_{ins}$ is highly stable Inasmuch as VCON.INS is applied as the control input to the insertion delay circuit 42 within every delay circuit 18 of FIG. 1, every delay circuit 18 has identical insertion delay $T_{ins}$. Substituting equations [4] and [5] into equation [2], the total delay of each delay circuit 18 of FIG. 1 is $$T_{tot} = [8m/K + n/K + 1/M]T_{ref}. \quad [6]$$

From equation [6] it is seen that the total delay $T_{tot}$ of each delay circuit 18 is proportional to the period $T_{ref}$ of the reference clock and the constant of proportionality is determined by a combination of m, n, K and M. K and M are constant frequency divider ratios and m and n are determined by the values of C0–C4. Therefore the delay provided by each delay circuit 18 is as stable as the period of the reference clock which is highly stable.

Figure 9:
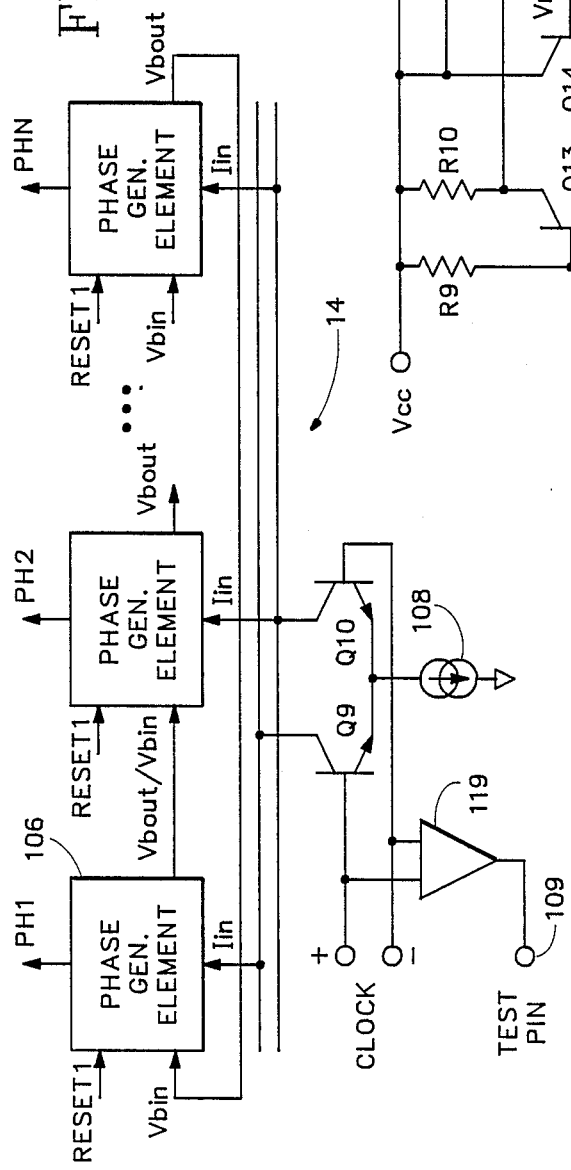
FIG. 9 is a combination block and schematic diagram of a phase generator of FIG. 1.

FIG. 9 is a combination block and schematic diagram of a phase generator suitable for use as a phase generator 14 of FIG. 1 adapted to produce N clock phase signals PH1–PHN, each having a period of $NT_{clock}/2$ where $T_{clock}$ is the period of the master CLOCK signal, the clock phase signals being phase shifted one from another by $T_{clock}/2$ seconds. The phase generator 14 comprises a sequence of N phase generator elements 106, each providing a separate one of the clock phase signal outputs PH1–PHN in response to a combination of three inputs, the RESET1 signal, a prebias signal Vbias (shown as Vbin), and a timing control signal Iin. Each phase generator element 106 also produces a Vbout output signal which is in phase with its phase signal output. The Vbout output signal of each phase generator element 106 is provided as Vbin the prebias input signal Vbias, to a next phase generator element of the sequence, with the Vbout output of the Nth phase generator element being supplied as the Vbias input to the first phase generator element of the sequence. The RESET1 signal output of counter 38 of FIG. 1 is provided in parallel to the RESET1 input of each phase generator element 106. The CLOCK signal is applied across the bases of an emitter coupled transistor pair Q9, Q10, the emitters of transistors Q9 and Q10 being coupled to ground through a current source 108. The collector of transistor Q9 is connected to the Iin input of the "odd" phase generator elements 106 which produce odd numbered clock phase signals PH1, PH3, ..., PH(N−1), and the collector of transistor Q10 is connected to the Iin input of the "even" phase generator elements which provide even numbered clock phases PH2, PH4, ..., PHN. (N is always an even number.)

Each phase generator element drives its clock phase signal output and its Vbout output high when the current from current source 108 is supplied to its Iin input, provided, however, that its prebias Vbias input (Vbin) is high at the time. When the input current Iin is terminated, the phase generator element drives its clock phase and Vbout output signals low. As the CLOCK signal oscillates, it alternately switches transistors Q9 and Q10 on, thereby alternately connecting current source 108 to the Iin input terminals of the even and odd clock phase generator elements. When transistor Q9 is on, only a single one of the odd clock phase generator elements drives its output signals high because only one of these elements has a high prebias input signal. Similarly, when transistor Q10 is on, only a single one of the even clock phase generator elements drives its output signals high because only one of these elements has a high prebias input signal. Each time a particular clock phase signal PH1–PHN is asserted, the prebias input to the next phase generator element in the sequence is also asserted, and when the CLOCK signal next changes state, the clock phase signal output of that next phase generator element is asserted.

Figure 10:
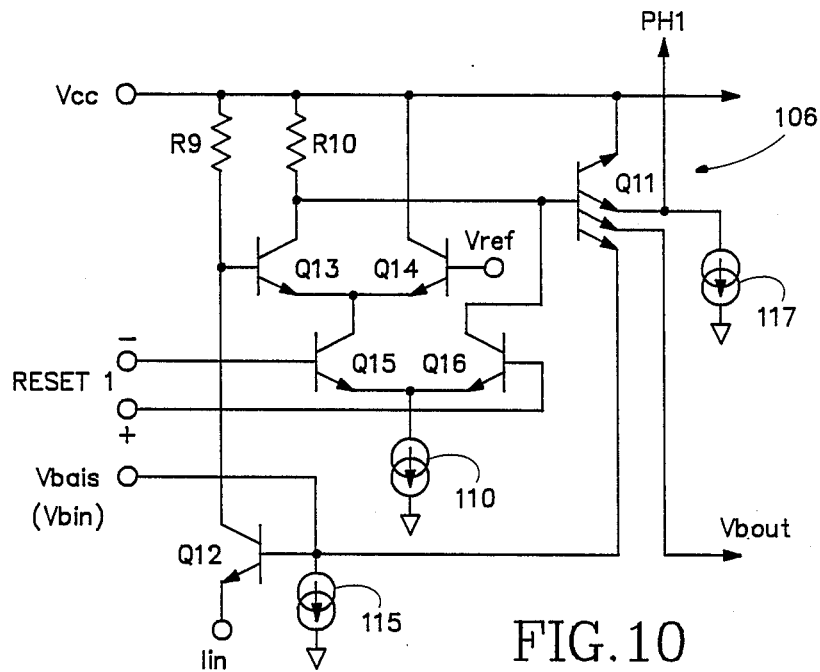

FIG. 10 is a schematic diagram of the phase generator element 106 of FIG. 9 that supplies the PH1 output signal. A three-emitter transistor Q11 provides the PH1 and Vbout signals at two of its emitters, and the third emitter is connected to the base of another transistor Q12. A current source 115 is also connected to the base of transistor Q12, and a current source 117 is connected to the emitter of transistor Q11 that provides the PH1 signal. The Iin input appears at the emitter of transistor Q12, and the collector of transistor Q12 is connected to a positive voltage source Vcc through a resistor R9. The Vbias (Vbin) input to element 106 is also supplied to the base of transistor Q12. The collector of transistor Q12 is connected to the base of a transistor Q13 and the collector of transistor Q13 is coupled to Vcc through another resistor R10, and coupled to the base of transistor Q11. The emitter of transistor Q13 is tied to the emitter of another transistor Q14, while the collector of transistor Q14 is tied directly to Vcc. The base of transistor Q14 is connected to a reference voltage source Vref. The RESET1 signal is applied across the bases of an emitter coupled transistor Q15 and Q16 being connected to a current source 110. The collector of transistor Q15 is tied to the emitters of transistors Q13 and Q14, while the collector of transistor Q16 is tied to the base of transistor Q11.

During normal operation, the RESET1 signal is negative so that transistor Q15 is on and transistor Q16 is off. Thus the current from current source 110 passes through either transistor Q13 or transistor Q14 via transistor Q15 depending on which transistor Q13 or Q14 is on and which is off. When the base of transistor Q11 is low, but prebias input signal Vbias is high, transistor Q12 will begin conducting current when the CLOCK signal next switches transistors Q9 and Q10 of FIG. 9 so as to supply current to transistor Q12. The current through the collector-emitter path of transistor Q12 pulls the base of transistor Q13 below Vref causing current from current source 110 to be switched through transistor Q14. The drop in current through resistor R10 pulls up the base of transistor Q11, thereby driving the PH1 and Vbout signals high. The third emitter of transistor Q11 keeps transistor Q12 on even though the transistor Q11 in the preceding phase generator element supplying the prebias input Vbias no longer pulls Vbias high. When the CLOCK signal changes state, transistor Q9 of FIG. 9 turns off and current is no longer supplied to transistor Q12. Transistor Q12 turns off, resistor R9 pulls the base of transistor Q13 above Vref, transistor Q13 turns on, and transistor Q14 turns off. As transistor Q13 turns on, it pulls down the base of transistor Q11, driving down PH1.

Figure 11:
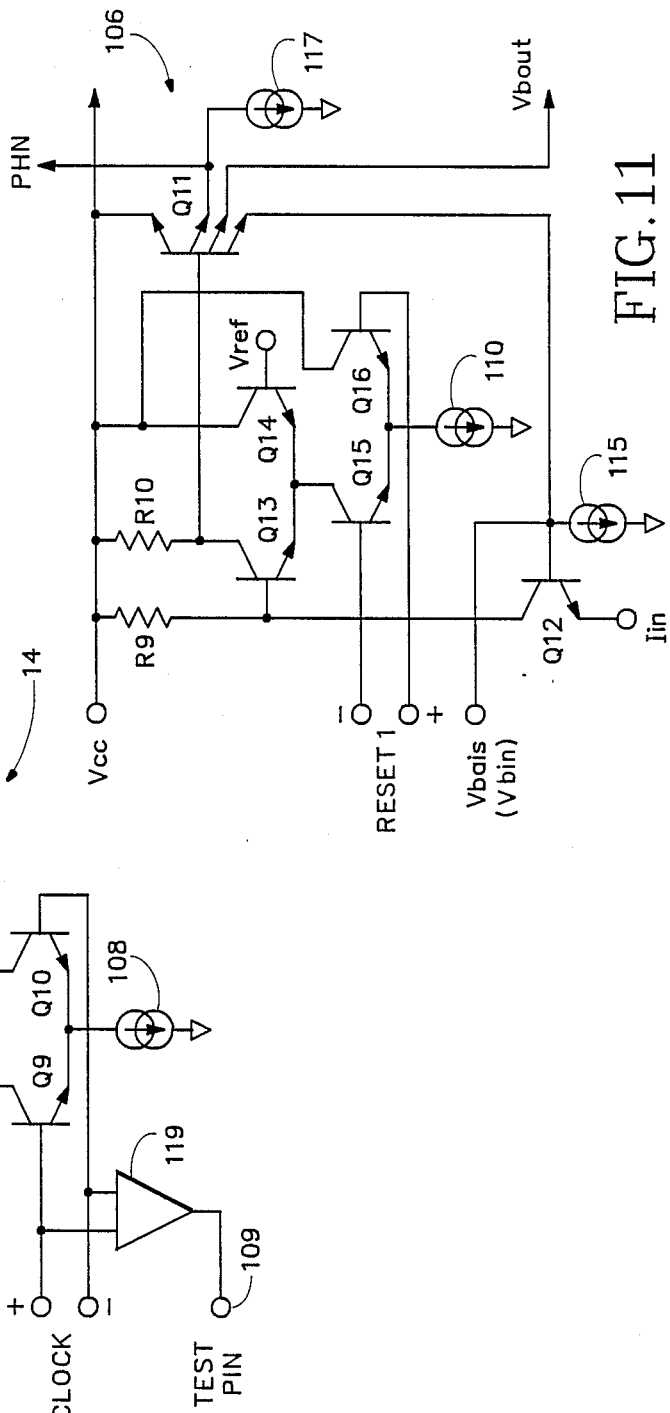
FIG. 10 and 11 are schematic diagrams of phase generator elements

All of the phase generator elements 106 of FIG. 9 are similar to the element illustrated in FIG. 11 except that, as shown in FIG. 10, the collector of transistor Q16 is tied to the base of transistor Q11 in the phase generator element that produces PH1. In all other phase generator elements, the collector of transistor Q16 is tied to Vcc, as shown in FIG. 11. When the RESET1 signal is asserted (driven positive), transistor Q15 in each phase generator element turns off and transistor Q16 turns on. In the first phase generator element (FIG. 10) transistor elements, (FIG. 11) since the collector of Q16 is tied to Vcc and not to the base of transistor Q11, transistor Q11 turns off, and PH2-PHN go low. When the RESET1 signal is subsequently deasserted while the CLOCK signal is high, the current from current source 108 of FIG. 9 keeps transistor Q12 on. Thereafter the clock phase signals PH1-PHN are asserted in proper order as the CLOCK signal continues to change state. Thus assertion and deassertion of the RESET1 signal initializes operation of the clock phase generator 14 of FIG. 9 so that PH1 is asserted.

The CLOCK signal across the bases of transistors Q9 and Q10 in each phase generator circuit 14 of FIGS. 1 and 9 is applied as input to a buffer 119 that supplies a signal to a test pin 109 on each integrated circuit 16. The test pins are used when calibrating the system. Each pulse of the CLOCK input generates a test signal pulse on the test pin 109. With reference to FIG. 1, the test signals on the test pins of pairs of integrated circuits may be input to a logic gate, for example an XOR gate (not shown), through matched delay transmission lines, and the output of the XOR gate may be monitored to determine if a test signal pulse on one test pin 109 rises substantially before or after the test signal pulse on the other test pin 109. The timing data C0–C4 supplied to each delay circuit 18 may then be adjusted in an interative fashion to ensure that pulses appear at each test pin 109 at the same time.

There has thus been described a clock signal skew compensator for adjustably delaying a clock signal so that it arrives at various nodes in a circuit at the same time. The invention may also be used to adjustably delay pulses of separately generated input signals applied to each delay circuit 18 or FIG. 1 so that they arrive at separate nodes 13 at the same time. While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. An apparatus for skew compensating pulse signals, each pulse signal including a sequence of pulses transmitted to separate nodes of a circuit, the apparatus comprising:
   a plurality of delay circuits, each delay circuit producing a separate output signal in response to an applied pulse signal, each delay circuit having first and second control inputs, each output signal comprising pulses delayed from corresponding signal pulses by an adjustable delay time, said delay time comprising a sum of a selected number of unit delays, said number of unit delays being selected by a first control signal applied to said first control input, said unit delay being of duration controlled by a second control signal applied to said second control unit; and
   means for coupling the output signal produced by each delay circuit to a separate one of said nodes.

2. The apparatus in accordance with claim 1 further comprising:
   delay setting means for generating a plurality of first control signals, each first control signal being applied to the first control input of a separate one of said delay circuits, each first control signal being set so that pulses of separate output signals arrive at said separate nodes substantially at the same time when the unit delays of said delay circuits are substantially similar; and
   unit delay monitor means for generating a second control signal applied in common to the second control input of each of said delay circuits, said second signal being continuously adjusted so that the unit delay of each delay circuit remains substantially constant.

3. The apparatus in accordance with claim 2 wherein said unit delay monitor means comprises:
   means for generating a periodic reference clock signal having a constant period;
   an oscillator for producing a periodic output signal of period determined in accordance with said second control signal; and
   means for producing said second control signal of magnitude determined in accordance with a comparison of the period of said reference clock signal with the period of said periodic output signal.

4. The apparatus in accordance with claim 1 wherein at least one of said delay circuits comprises:
   a plurality of unit delay elements, each for producing an output signal pulse in response to an input signal pulse, the output signal pulse being delayed from said input signal pulse by said unit delay controlled by said second control signal; and
   means for interconnecting a selected number of said unit delay elements to form a sequence of delay elements for delaying a pulse signal by at least the sum of unit delays of said selected number of unit delay elements, said number of unit delay elements being selected in accordance with said first control signal.

5. The apparatus in accordance with claim 4 wherein each of said unit delay elements comprises:
   means for delaying said input signal to produce a first output signal;
   first amplifier means for amplifying said input signal by a first gain factor to produce a second output signal;
   a second amplifier for amplifying said first output signal by a second gain factor to produce a third amplified output signal;
   means for producing a fourth output signal comprising a sum of said second and third output signals; and
   means for controlling the first and second gain factors in accordance with said second control signal.

6. An apparatus for skew compensating pulse signals, each pulse signal including a sequence of pulses transmitted to separate nodes of a circuit, the apparatus comprising:

a plurality of delay circuits, each delay circuit producing a separate output signal in response to an applied pulse signal, each delay circuit having first and second control inputs, each output signal comprising pulses delayed from corresponding signal pulses by an adjustable delay time, said delay time comprising a sum of a selected number of unit delays, said number of unit delays being selected by a first control signal applied to said first control input, said unit delay being of duration controlled by a second control signal applied to said second control input;

means for coupling the output signal produced by each delay circuit to a separate one of said nodes;

delay setting means for generating a plurality of first control signals, each first control signal being applied to the first control input of a separate one of said delay circuits, each first control signal being set so that pulses of separate output signals arrive at said nodes substantially at the same time when the unit delays of said delay circuits are substantially similar;

means for generating a periodic reference clock signal having a constant period;

an oscillator for producing a periodic output signal of period determined in accordance with said second control signal; and means for producing said second control signal of magnitude determined in accordance with a comparison of the period of said reference clock signal with the period of said periodic output signal, said second control signal being applied in common to the second control input of each of said delay circuits.

7. The apparatus in accordance with claim 6 wherein at least one of said delay circuits comprises:

a plurality of unit delay elements, each for producing a output signal pulse in response to an input signal pulse, the output signal pulse being delayed from said input signal pulse by said unit delay controlled by said second control signal; and means for interconnecting a selected number of said unit delay elements to form a sequence of delay elements for delaying a pulse signal by at least the sum of unit delays of said selected number of unit delay elements, said number of unit delay elements being selected in accordance with said first control signal.

8. An apparatus for skew compensating pulse signals, each pulse signal including a sequence of pulses transmitted to separate nodes of a circuit, the apparatus comprising:

a plurality of delay circuits, each delay circuit producing a separate output signal in response to an applied pulse signal, each delay circuit having first, second and third control inputs, each output signal comprising pulses delayed from corresponding signal pulses by an adjustable delay time, said delay time comprising a sum of a selected number of unit delays and an insertion delay, said number of unit delays being selected by a first control signal applied to said first control input, said unit delay being of duration controlled by a second control signal applied to said second control input, and said insertion delay being controlled by a third control signal applied to said third control input; and means for coupling the output signal produced by each delay circuit to a separate one of said nodes.

9. The apparatus in accordance with claim 8 further comprising:

delay setting means for generating a plurality of first control signals, each first control signal being applied to the first control input of a separate one of said delay circuits, each first control signal being set so that pulses of separate output signals arrive at said nodes substantially at the same time when said delay circuits have the same insertion delay and the same unit delay;

unit delay monitor means for generating a second control signal applied in common to the second control input of each said delay circuits, said control signal being continuously adjusted so that the unit delay of each delay circuit remains constant; and insertion delay monitor means for generating a third control signal applied in common to the third control input of each said delay circuits, said third signal being continuously adjusted so that the insertion delay of each delay circuit remains constant.

10. The apparatus in accordance with claim 9 wherein said unit delay monitor means comprises:

means for generating a periodic reference clock signal having a constant period;

an oscillator for producing a periodic output signal of period proportional to said unit delay, the duration of said unit delay being determined in accordance with said second control signal; and means for producing said second control signal of magnitude determined in accordance with a comparison of the period of said reference clock signal with the period of said periodic output signal.

11. The apparatus in accordance with claim 9 wherein said insertion delay monitor means comprises:

means for generating a periodic reference clock signal having a constant period;

an oscillator for producing a periodic output signal of period being determined in accordance with said third control signal; and means for producing said third control signal of magnitude determined in accordance with a difference between the period of said reference clock signal and the period of said periodic output signal.

12. The apparatus in accordance with claim 8 wherein at least one of said delay circuits comprises:

a plurality of unit delay elements, each for producing an output signal pulse in response to an input signal pulse, the output signal pulse being delayed from said input signal pulse by said unit delay controlled by said second control signal;

an insertion delay element for producing an output signal pulse in response to an input signal pulse, the output signal pulse being delayed from the input signal pulse by a delay time controlled by said third control signal; and means for interconnecting a selected number of said unit delay elements with said insertion delay element to form a sequence of delay elements for delaying a pulse signal by at least the sum of the unit delay of said selected number of unit delay elements and the delay time of said insertion delay element, said number of unit delay elements being selected in accordance with said first control signal.

13. The apparatus in accordance with claim 12 wherein each of said unit delay elements comprises:
means for delaying said input signal to produce a first output signal;
first amplifier means for amplifying said input signal by a first amplification factor to produce a second output signal;
a second amplifier for amplifying said first output signal by a second amplification factor to produce a third amplified output signal;
means for producing a fourth output signal comprising a sum of said second and third output signals; and
means for controlling the first and second amplification factors in accordance with said third control signal.

14. An apparatus for providing skew compensated clock signals to separate nodes of a circuit comprising:
means for generating a master clock signal comprising a sequence of pulses;
a plurality of delay circuits, each for producing in response to said master clock signal a separate output clock signal and each having first, second and third control inputs, each output clock signal comprising pulses delayed from corresponding master clock signal pulses by an adjustable delay time, said delay time comprising a sum of a selected number of unit delays and an insertion delay, said number of unit delays being selected by a first control signal applied to said first control input, said unit delay being of duration controlled by a second control signal applied to said second control input, and said insertion delay being controlled by a second control signal applied to said third control input;
means for conducting the output clock signal produced by each delay circuit to a separate one of said nodes;
delay setting means for generating a plurality of first control signals, each first control signal being applied to the first control input of a separate one of said delay circuits, each first control signal being set so that pulses of separate output clock signals corresponding to the same pulse of the master clock signal arrive at said nodes substantially at the same time when each delay circuit has substantially the same insertion delay and substantially the same unit delay;
means for generating a periodic reference clock signal having a constant period;
a first oscillator for producing a first periodic output signal of period determined in accordance with said second control signal;
means for producing said second control signal of magnitude determined in accordance with a comparison of the period of said reference clock signal with the period of said first periodic output signal;
a second oscillator for producing a second periodic output signal of period proportional to said insertion delay, the duration of said insertion delay being determined in accordance with said third control signal; and
means for producing said third control signal of magnitude determined in accordance with a difference between the period of said reference clock signal and the period of said second periodic output signal.

15. The apparatus in accordance with claim 14 wherein at least one of said delay circuits comprises:
a plurality of unit delay elements, each for producing an output signal pulse in response to an input signal pulse, the output signal pulse being delayed from said input signal pulse by said unit delay controlled by said second control signal;
an insertion delay element for producing an output signal pulse in response to an input signal pulse, the output signal pulse being delayed from the input signal pulse by a delay time controlled by said third control signal; and
means for interconnecting a selected number of said unit delay elements with said insertion delay element to form a sequence of delay elements for delaying said master clock signal by at least the sum of unit delays of said selected number of unit delay elements and the delay time of said insertion delay element, said number of unit delay elements being selected in accordance with said first control signal.

* * * * *